United States Patent
Chen et al.

(10) Patent No.: US 11,616,168 B2
(45) Date of Patent: Mar. 28, 2023

(54) MICRO LIGHT-EMITTING DIODE DISPLAY

(71) Applicant: PlayNitride Display Co., Ltd., MiaoLi County (TW)

(72) Inventors: Yen-Yeh Chen, MiaoLi County (TW); Chih-Ling Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 86 days.

(21) Appl. No.: 17/128,183

(22) Filed: Dec. 20, 2020

(65) Prior Publication Data

US 2022/0131040 A1    Apr. 28, 2022

(30) Foreign Application Priority Data

Oct. 26, 2020    (TW) .................................. 109137075

(51) Int. Cl.
*H01L 27/15* (2006.01)
*H01L 33/24* (2010.01)
(Continued)

(52) U.S. Cl.
CPC ............ *H01L 33/24* (2013.01); *H01L 27/156* (2013.01); *H01L 33/46* (2013.01); *H01L 33/62* (2013.01)

(58) Field of Classification Search
None
See application file for complete search history.

(56) References Cited

U.S. PATENT DOCUMENTS 10,205,055 B2 *  2/2019  Chu ...................... H01L 27/156
2015/0179888 A1   6/2015  Wu et al.
(Continued)

FOREIGN PATENT DOCUMENTS

| CN | 107742636 | 2/2018 |
|---|---|---|
| CN | 107768495 | 3/2018 |
| CN | 110034214 | 7/2019 |
| JP | 2003168762 | 6/2003 |
| TW | 201613133 | 4/2016 |
| TW | I635630 | 9/2018 |
| TW | I707491 | 10/2020 |

OTHER PUBLICATIONS

"Office Action of Taiwan Counterpart Application", dated Jan. 26, 2022, p. 1-p. 8.

(Continued)

*Primary Examiner* — Robert K Carpenter
(74) *Attorney, Agent, or Firm* — JCIPRNET

(57) ABSTRACT

A micro light-emitting diode display includes a first-type semiconductor base layer, a plurality of semiconductor light-emitting mesas dispersedly disposed on the first-type semiconductor base layer, a semiconductor heightening portion disposed on the first-type semiconductor base layer, a first bonding metal layer disposed on the semiconductor heightening portion, and a plurality of second bonding metal layers respectively disposed on the semiconductor light-emitting mesas. A top surface of the semiconductor heightening portion and a plurality of top surfaces of the semiconductor light-emitting mesas facing away from the first-type semiconductor base layer are coplanar. The top surface of the semiconductor heightening portion forms a first bonding surface adjacent to the first bonding metal layer. The top surfaces of the semiconductor light-emitting mesas respectively form a plurality of second bonding surfaces adjacent to the second bonding metal layers, and the first bonding surface and the second bonding surfaces are coplanar.

21 Claims, 8 Drawing Sheets

(51) Int. Cl.
*H01L 33/46* (2010.01)
*H01L 33/62* (2010.01)

(56) References Cited

U.S. PATENT DOCUMENTS

| | | |
|---|---|---|
| 2017/0162091 A1* | 6/2017 | Wu .................... H01L 27/156 |
| 2018/0047876 A1 | 2/2018 | Ch et al. |
| 2019/0164947 A1 | 5/2019 | Yoo |
| 2019/0198709 A1 | 6/2019 | Wildeson et al. |

OTHER PUBLICATIONS

"Office Action of China Counterpart Application", dated May 20, 2022, p. 1-p. 8.

* cited by examiner

MICRO LIGHT-EMITTING DIODE DISPLAY

CROSS-REFERENCE TO RELATED APPLICATION

This application claims the priority benefit of Taiwanese application serial no. 109137075, filed on Oct. 26, 2020. The entirety of the above-mentioned patent application is hereby incorporated by reference herein and made a part of this specification.

BACKGROUND

Technical Field

The disclosure relates to a display, and in particular, relates to a micro light-emitting diode display.

Description of Related Art

In a light-emitting diode display, the light-emitting diodes are arranged into an array. Different light-emitting diodes may use the first-type semiconductor (e.g., N-type) base layer as a common electrode. The first-type semiconductor base layer is electrically connected to a corresponding electrode on the circuit substrate (e.g., a TFT display substrate). The second-type semiconductors (e.g., P-type) of the light-emitting diodes are electrically connected to the circuit substrate. At present, a metal heightening layer is required to be disposed, such that the bonding region corresponding to the first-type semiconductor base layer and the bonding regions corresponding to the second-type semiconductors are coplanar. Nevertheless, the metal heightening layer is required to be fabricated through an additional process, so that process time and costs are increased. In addition, as sizes of the light-emitting diodes are reduced (such as a micro light-emitting diode), greater film thickness accuracy of the metal heightening layer itself is required, so that poor bonding yield of the second-type semiconductors may be easily produced as affected by the film thickness error of the metal heightening layer.

SUMMARY

The disclosure provides a micro light-emitting diode display requiring reduced process time and costs.

According to an embodiment of the disclosure, a micro light-emitting diode display including a first-type semiconductor base layer, a plurality of semiconductor light-emitting mesas, a semiconductor heightening portion, a first bonding metal layer, and a plurality of second bonding metal layers is provided. The semiconductor light-emitting mesas are dispersedly disposed on the first-type semiconductor base layer. The semiconductor heightening portion is disposed on the first-type semiconductor base layer. A top surface of the semiconductor heightening portion facing away from the first-type semiconductor base layer and a plurality of top surfaces of the semiconductor light-emitting mesas facing away from the first-type semiconductor base layer are coplanar. The first bonding metal layer is disposed on the semiconductor heightening portion. The second bonding metal layers are respectively disposed on the semiconductor light-emitting mesas. The top surface of the semiconductor heightening portion forms a first bonding surface adjacent to the first bonding metal layer. The top surfaces of the semiconductor light-emitting mesas respectively form a plurality of second bonding surfaces adjacent to the second bonding metal layers, and the first bonding surface and the second bonding surfaces are coplanar.

According to another embodiment of the disclosure, a micro light-emitting diode display including a first-type semiconductor base layer, a plurality of semiconductor light-emitting mesas, an insulating heightening portion, a first bonding metal layer, and a plurality of second bonding metal layers is provided. The semiconductor light-emitting mesas are dispersedly disposed on the first-type semiconductor base layer. The insulating heightening portion is disposed on the first-type semiconductor base layer. A top surface of the insulating heightening portion facing away from the first-type semiconductor base layer and a plurality of top surfaces of the semiconductor light-emitting mesas facing away from the first-type semiconductor base layer are coplanar. The first bonding metal layer is disposed on the insulating heightening portion. The second bonding metal layers are respectively disposed on the semiconductor light-emitting mesas.

To sum up, in the micro light-emitting diode display provided by an embodiment of the disclosure, the semiconductor heightening portion is provided, and in this way, the bonding region corresponding to the first-type semiconductor and the bonding region corresponding to the second-type semiconductor are coplanar. Further, the semiconductor heightening portion may be fabricated through the process of fabricating the semiconductor light-emitting mesas. In other words, an addition process for fabricating the metal heightening layer is not required, time and costs are lowered, and the bonding yield problem caused by the film thickness accuracy of the metal heightening layer in the related art is also avoided. In addition, in the micro light-emitting diode display provided by another embodiment of the disclosure, the insulating heightening portion is provided, and in this way, the bonding region corresponding to the first-type semiconductor and the bonding region corresponding to the second-type semiconductor are coplanar.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
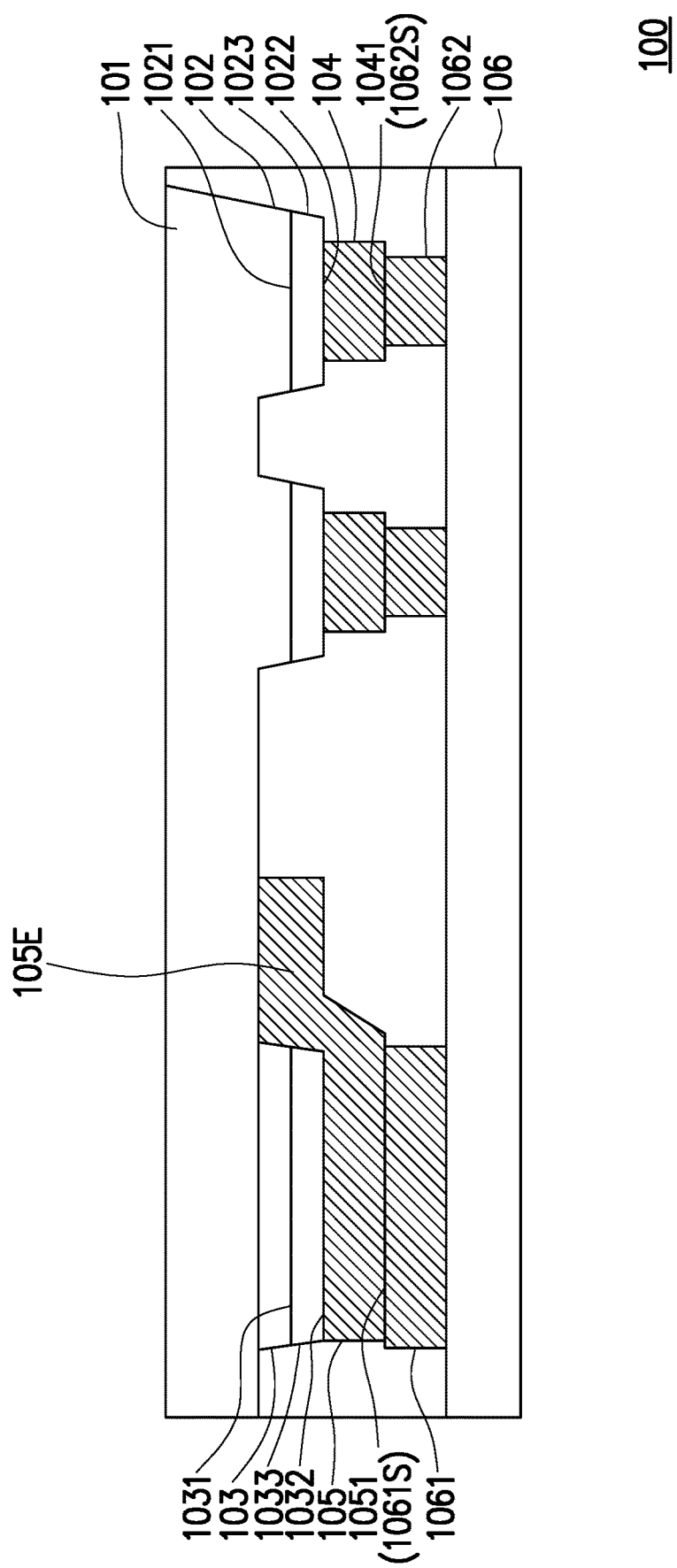
FIG. 1 to FIG. 5 are cross-sectional views illustrating portions of micro light-emitting diode displays according to a first embodiment to a fifth embodiment of the disclosure.

With reference to FIG. 1, which is a cross-sectional view illustrating a portion of a micro light-emitting diode display 100 according to a first embodiment of the disclosure. The micro light-emitting diode display 100 includes a first-type semiconductor base layer 101, a plurality of semiconductor light-emitting mesas 102, a semiconductor heightening portion 103, a first bonding metal layer 105, and a plurality of second bonding metal layers 104. The semiconductor light-emitting mesas 102 are dispersedly disposed on the first-type semiconductor base layer 101. The semiconductor heightening portion 103 is disposed on the first-type semiconductor base layer 101, and a top surface of the semiconductor heightening portion 103 facing away from the first-type semiconductor base layer 101 and a plurality of top surfaces of the semiconductor light-emitting mesas 102 facing away from the first-type semiconductor base layer 101 are coplanar.

To be specific, the semiconductor heightening portion 103 may be fabricated through a process of fabricating the semiconductor light-emitting mesas 102 and has a structure similar to that of the semiconductor light-emitting mesas 102. In the present embodiment, the semiconductor light-emitting mesas 102 may be fabricated by, for example, an etching process, and the semiconductor heightening portion 103 may also be fabricated through the same etching process. Each of the semiconductor light-emitting mesas 102 includes a first-type semiconductor layer (not shown) connected to the first-type semiconductor base layer 101, a light-emitting layer 1021, and a second-type semiconductor layer 1023 away from the first-type semiconductor base layer 101. The semiconductor heightening portion 103 includes a first-type semiconductor layer (not shown) connected to the first-type semiconductor base layer 101, an active layer 1031, and a second-type semiconductor layer 1033 away from the first-type semiconductor base layer 101. An electrical polarity of the second-type semiconductor layers 1023 and the second-type semiconductor layer 1033 is opposite to an electrical polarity of the first-type semiconductor base layer 101.

According to an embodiment of the disclosure, the first-type semiconductor base layer 101 is a N-type semiconductor. Further, each of the semiconductor light-emitting mesas 102 includes a N-type semiconductor layer connected to the first-type semiconductor base layer 101, the light-emitting layer 1021, and a P-type semiconductor layer (i.e., the second-type semiconductor layer 1023 shown in FIG. 1) away from the first-type semiconductor base layer 101. The light-emitting layer 1021 is located between the N-type semiconductor layer and the P-type semiconductor layer and may be, for example, a multiple quantum well (MQW). Similarly, the semiconductor heightening portion 103 also includes a N-type semiconductor layer connected to the first-type semiconductor base layer 101, the active layer 1031, and a P-type semiconductor layer (i.e., the second-type semiconductor layer 1033 shown in FIG. 1) away from the first-type semiconductor base layer 101. Note that since the film layers in a semiconductor structure are formed together in a process, the semiconductor heightening portion 103 and the semiconductor light-emitting mesa 102 may be fabricated in the same etching process. In this way, a process used in the related art for fabricating a metal heightening layer may be omitted, and fabrication time and costs are thereby lowered. Further, the semiconductor heightening portion 103, the semiconductor light-emitting mesas 102, and the first-type semiconductor base layer 101 adopt a same semiconductor material, and the three form an integrated structure in an epitaxial layer.

In another embodiment of the disclosure, the first-type semiconductor base layer 101 may be, for example, a P-type semiconductor. A portion of each of the semiconductor light-emitting mesas 102 and the semiconductor heightening portion 103 connected to the first-type semiconductor base layer 101 is a P-type semiconductor layer, and a portion away from the first-type semiconductor base layer 101 is a N-type semiconductor layer.

In the embodiment of FIG. 1, the first bonding metal layer 105 is disposed on the semiconductor heightening portion 103. The second bonding metal layers 104 are respectively disposed on the semiconductor light-emitting mesas 102. The top surface of the semiconductor heightening portion 103 forms a first bonding surface 1032 adjacent to the first bonding metal layer 105. The top surfaces of the semiconductor light-emitting mesas 102 respectively form a plurality of second bonding surfaces 1022 adjacent to the second bonding metal layers 104. As described above, the semiconductor light-emitting mesas 102 and the semiconductor heightening portion 103 may be fabricated through the same etching process. As such, the top surfaces of the semiconductor light-emitting mesas 102 and the top surface of the semiconductor heightening portion 103 may be controlled to be coplanar through the above-mentioned etching process. In other words, the first bonding surface 1032 between the semiconductor heightening portion 103 and the first bonding metal layer 105 and the second bonding surfaces 1022 between the semiconductor light-emitting mesas 102 and the second bonding metal layers 104 are coplanar.

The first bonding metal layer 105 and the second bonding metal layers 104 may be formed through, for example, a deposition process, and deposition thicknesses thereof may be controlled through a process condition. The first bonding surface 1032 and the second bonding surfaces 1022 are coplanar. In this way, when deposition thicknesses of the first bonding metal layer 105 and the second bonding metal layers 104 are controlled, a top surface 1051 of the first bonding metal layer 105 and top surfaces 1041 of the second bonding metal layers 104 may exhibit favorable flatness and are maintained to be coplanar.

According to the above, it can be seen that the micro light-emitting diode display 100 provided by the first embodiment of the disclosure includes the semiconductor heightening portion 103, and the semiconductor heightening portion 103 and the semiconductor light-emitting mesas 102 may be fabricated through the same process. As such, the semiconductor heightening portion 103 and the semiconductor light-emitting mesas 102 have the same etching condition and process time, so that the top surfaces of the two are coplanar. When the deposition thickness of the first bonding metal layer 105 deposited on the semiconductor heightening portion 103 and the deposition thicknesses of the second bonding metal layers 104 deposited on the semiconductor light-emitting mesas 102 are the same, the top surface 1051 of the first bonding metal layer 105 and the top surfaces 1041 of the second bonding metal layers 104 are coplanar as well and may exhibit favorable flatness, which facilitates a process of bonding a circuit substrate 106 to be described below.

With reference to FIG. 1 again, the micro light-emitting diode display 100 further includes the circuit substrate 106, a third bonding metal layer 1061, and a plurality of fourth bonding metal layers 1062. In an embodiment, the circuit substrate 106 may be implemented as an integrated circuit (IC), for example. The third bonding metal layer 1061 electrically connects the first bonding metal layer 105 and the circuit substrate 106. The fourth bonding metal layers 1062 respectively electrically connect the second bonding metal layers 104 and the circuit substrate 106. As described above, since the top surface 1051 of the first bonding metal layer 105 and the top surfaces 1041 of the second bonding metal layers 104 are coplanar, a bonding surface 1061S between the first bonding metal layer 105 and the third bonding metal layer 1061 is coplanar with a bonding surface 1062S between each of the second bonding metal layers 104 and a corresponding one of the fourth bonding metal layers 1062. In this way, a bonding yield between the first bonding metal layer 105 and the third bonding metal layer 1061 and a bonding yield between each of the second bonding metal layers 104 and the corresponding fourth bonding metal layer 1062 are increased.

When a voltage is applied to the third bonding metal layer 1061 and the fourth bonding metal layers 1062 by the circuit substrate 106, a current generated by a potential difference between the third bonding metal layer 1061 and the fourth bonding metal layers 1062 may enable the semiconductor light-emitting mesas 102 to emit a (visible) light beam. To be specific, the first-type semiconductor base layer 101 acts as a common electrode of the micro light-emitting diode display 100. When a voltage is applied to the third bonding metal layer 1061 and the fourth bonding metal layers 1062 by the circuit substrate 106, an electrical polarity of the first bonding metal layer 105 is opposite to an electrical polarity of the second bonding metal layers 104. As the first-type semiconductor layers (not shown) of the semiconductor light-emitting mesas 102 contact the first-type semiconductor base layer 101, a potential difference is provided between the first-type semiconductor layers and the second-type semiconductor layers 1023, such that recombination occurs in electrons and holes in the light-emitting layer 1021 and light is thereby generated. To be more specific, controlling may be performed by an active device of the circuit substrate 106. For instance, different voltages may be applied to the fourth bonding metal layers 1062 corresponding to different semiconductor light-emitting mesas 102, and in this way, different semiconductor light-emitting mesas 102 may emit light beams of different intensities as affected by different potential differences. Image information may therefore be presented in an image frame of the micro light-emitting diode display 100.

Note that in this embodiment, the first bonding metal layer 105 includes an extension section 105E extending from a side surface of the semiconductor heightening portion 103 to the first-type semiconductor base layer 101. The first bonding metal layer 105 is electrically bonded to the first-type semiconductor base layer 101 through the extension section 105E thereof. As such, when a voltage is applied to the third bonding metal layer 1061 by the circuit substrate 106, a current (or an electron flow) reaches the first-type semiconductor base layer 101 from the circuit substrate 106 by passing through the third bonding metal layer 1061 and the first bonding metal layer 105, but less passing through the semiconductor heightening portion 103. That is because a resistance value of the first bonding metal layer 105 is less than that of the semiconductor heightening portion 103. From another perspective, when a voltage is applied to the third bonding metal layer 1061 by the circuit substrate 106, the voltage applied to the semiconductor heightening portion 103 is a reverse-bias voltage, therefore recombination does not occur in electrons and holes in the active layer 1031 of the semiconductor heightening portion 103, so light is not emitted. The semiconductor heightening portion 103 is a dummy semiconductor layer.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiments for the omitted contents, which will not be repeated hereinafter.

Figure 2:
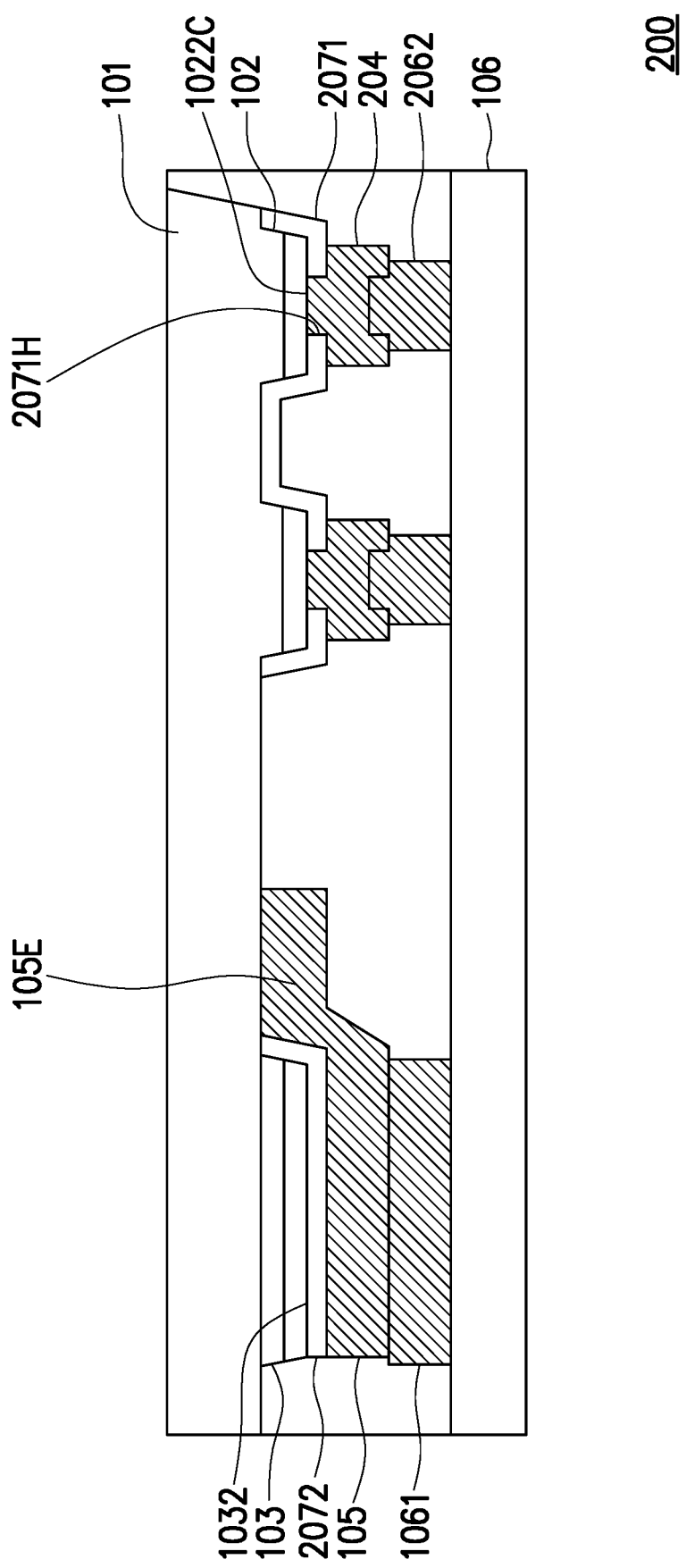

With reference to FIG. 2, which is a cross-sectional view illustrating a portion of a micro light-emitting diode display 200 according to a second embodiment of the disclosure. The micro light-emitting diode display 200 includes the first-type semiconductor base layer 101, the plurality of semiconductor light-emitting mesas 102, the semiconductor heightening portion 103, the first bonding metal layer 105, a plurality of second bonding metal layers 204, the circuit substrate 106, the third bonding metal layer 1061, and a plurality of fourth bonding metal layers 2062.

Different from the micro light-emitting diode display 100, the micro light-emitting diode display 200 further includes an insulating layer 2071. The insulating layer 2071 covers a portion of each of the semiconductor light-emitting mesas 102 and exposes another portion of each of the semiconductor light-emitting mesas 102. To be specific, each of the semiconductor light-emitting mesas 102 is bonded to the a corresponding one of the second bonding metal layers 204 through a second bonding surface 1022C, as shown in FIG. 2. From another perspective, the insulating layer 2071 has a plurality of openings 2071H to expose the other portions of the semiconductor light-emitting mesas 102. Further, the second bonding metal layers 204 are respectively embedded in the openings 2071H. Each of the semiconductor light-emitting mesas 102 is bonded to the corresponding second bonding metal layer 204 through the second bonding surface 1022C.

The micro light-emitting diode display 200 further includes an insulating layer 2072. The insulating layer 2072 is disposed between the semiconductor heightening portion 103 and the first bonding metal layer 105. The insulating layer 2072 is bonded to the top surface of the semiconductor heightening portion 103 on the first bonding surface 1032. The first bonding surface 1032 and the second bonding surfaces 1022C are coplanar. The insulating layers 2071 and 2072 may be nitride layers or passivation layers, which should however not be construed as limitations to the disclosure.

Figure 3:
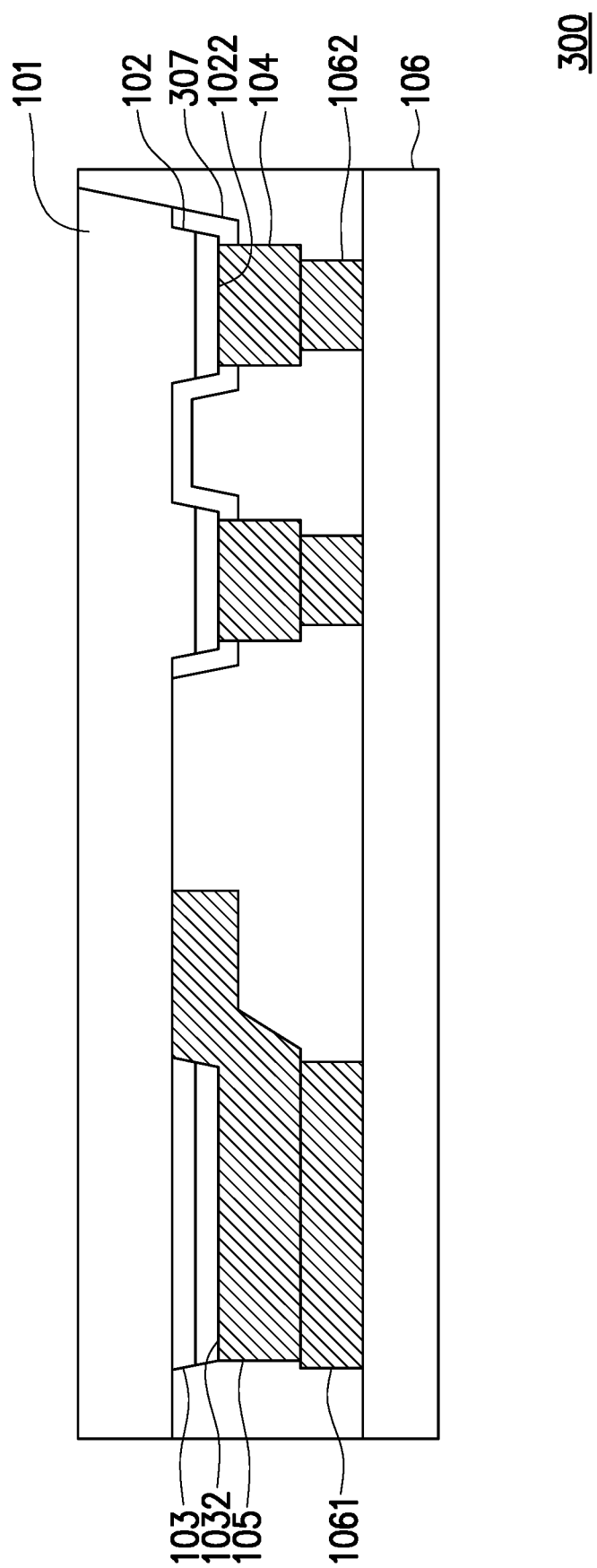

With reference to FIG. 3, which is a cross-sectional view illustrating a portion of a micro light-emitting diode display 300 according to a third embodiment of the disclosure. The micro light-emitting diode display 300 includes the first-type semiconductor base layer 101, the plurality of semiconductor light-emitting mesas 102, the semiconductor heightening portion 103, the first bonding metal layer 105, the plurality of second bonding metal layers 104, the circuit substrate 106, the third bonding metal layer 1061, the plurality of fourth bonding metal layers 1062, and an insulating layer 307. The top surface of the semiconductor heightening portion 103 forms the first bonding surface 1032 adjacent to the first bonding metal layer 105, and the top surfaces of the semiconductor light-emitting mesas 102 respectively form the plurality of second bonding surfaces 1022 adjacent to the second bonding metal layers 104. The first bonding surface 1032 between the semiconductor heightening portion 103 and the first bonding metal layer 105 and the second bonding surfaces 1022 between the semiconductor light-emitting mesas 102 and the second bonding metal layers 104 are coplanar. The insulating layer 307 covers side surfaces and part of the top surfaces of the semiconductor light-emitting mesas 102.

Figure 4:
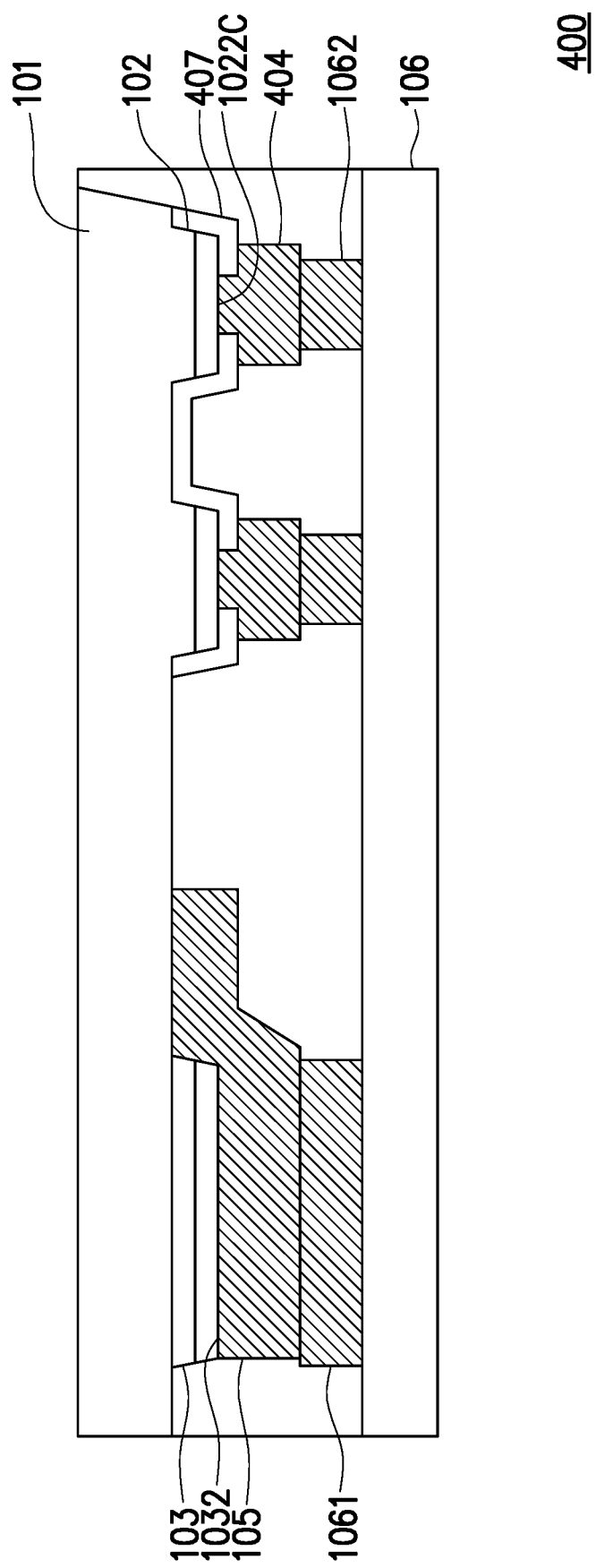

With reference to FIG. 4, which is a cross-sectional view illustrating a portion of a micro light-emitting diode display 400 according to a fourth embodiment of the disclosure. The micro light-emitting diode display 400 includes the first-type semiconductor base layer 101, the plurality of semiconductor light-emitting mesas 102, the semiconductor heightening portion 103, the first bonding metal layer 105, a plurality of second bonding metal layers 404, the circuit substrate 106, the third bonding metal layer 1061, the plurality of fourth bonding metal layers 1062, and an insulating layer 407. The top surface of the semiconductor heightening portion 103 forms the first bonding surface 1032 adjacent to the first bonding metal layer 105, and the top surfaces of the semiconductor light-emitting mesas 102 respectively form the plurality of second bonding surfaces 1022C adjacent to the second bonding metal layers 404. The first bonding surface 1032 between the semiconductor heightening portion 103 and the first bonding metal layer 105 and the second bonding surfaces 1022C between the semiconductor light-emitting mesas 102 and the second bonding metal layers 404 are coplanar. The insulating layer 407 covers the side surface and a portion of the top surface of each of the semiconductor light-emitting mesas 102 and exposes another portion of the top surface of each of the semiconductor light-emitting mesas 102 to be bonded to a corresponding one of the second bonding metal layers 404.

Figure 5:
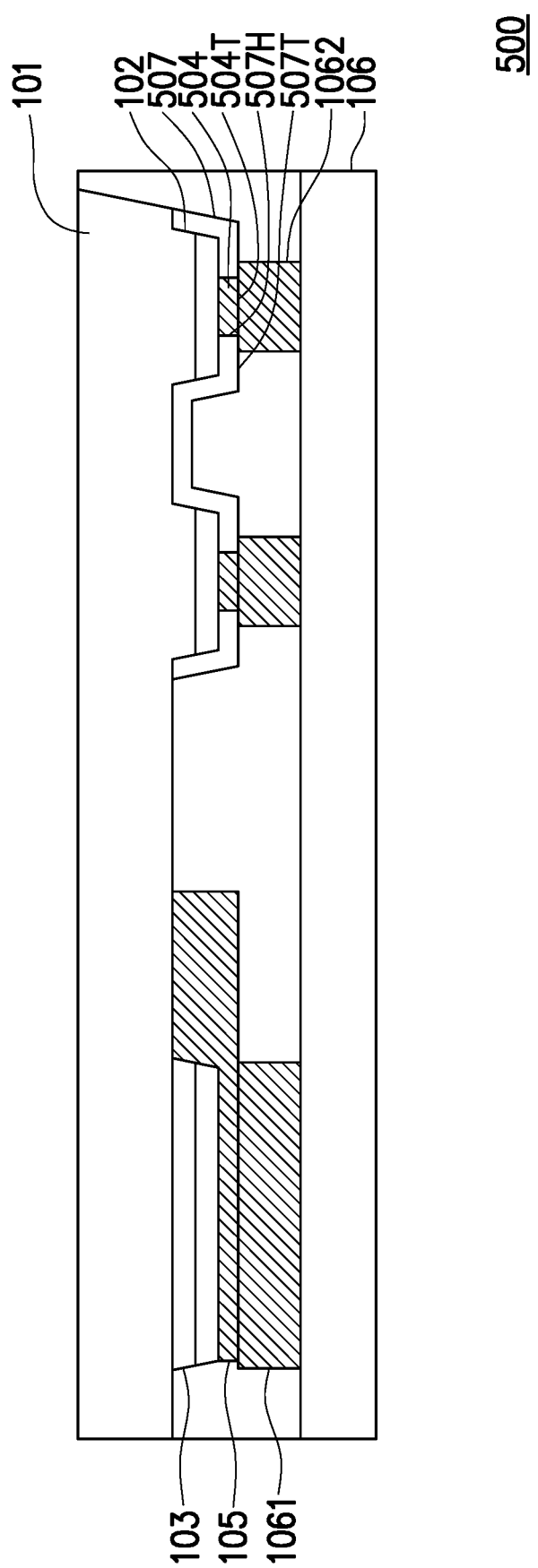

With reference to FIG. 5, which is a cross-sectional view illustrating a portion of a micro light-emitting diode display 500 according to a fifth embodiment of the disclosure. The micro light-emitting diode display 500 includes the first-type semiconductor base layer 101, the plurality of semiconductor light-emitting mesas 102, the semiconductor heightening portion 103, the first bonding metal layer 105, a plurality of second bonding metal layers 504, the circuit substrate 106, the third bonding metal layer 1061, the plurality of fourth bonding metal layers 1062, and an insulating layer 507. The insulating layer 507 has a plurality of openings 507H to expose a portion of the top surface of each of the semiconductor light-emitting mesas 102, and the second bonding metal layers 504 are embedded in the openings 507H to be bonded to the corresponding semiconductor light-emitting mesas 102. Top surfaces 504T of the second bonding metal layers 504 facing away from the first-type semiconductor base layer 101 are aligned with a top surface 507T of the insulating layer 507 facing away from the first-type semiconductor base layer 101.

Figure 6A:
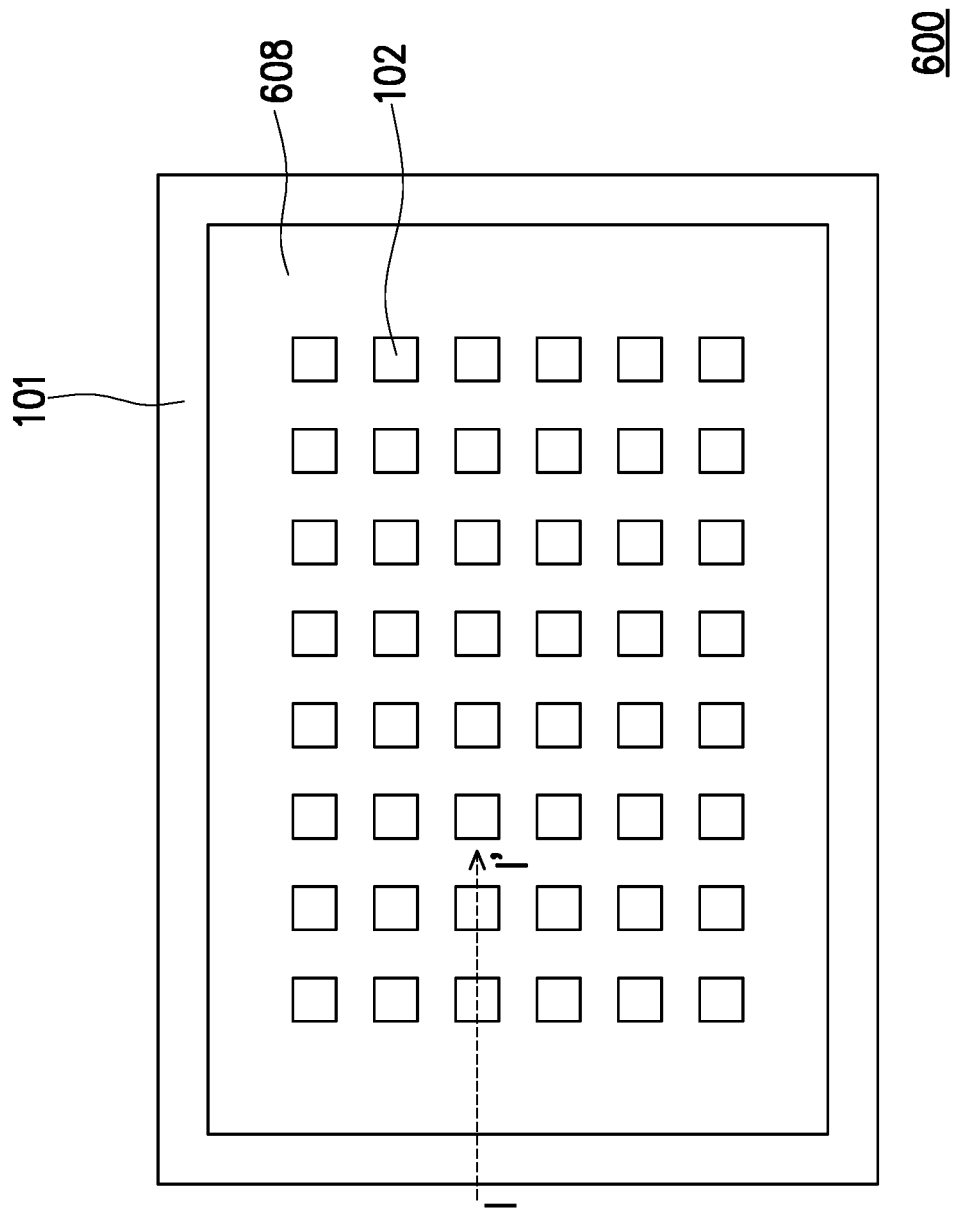
FIG. 6A is a schematic plan view illustrating a micro light-emitting diode display according to a sixth embodiment of the disclosure, and 6B is a cross-sectional view illustrating the micro light-emitting diode display of FIG. 6A taken along a line I-I'.
Figure 6B:
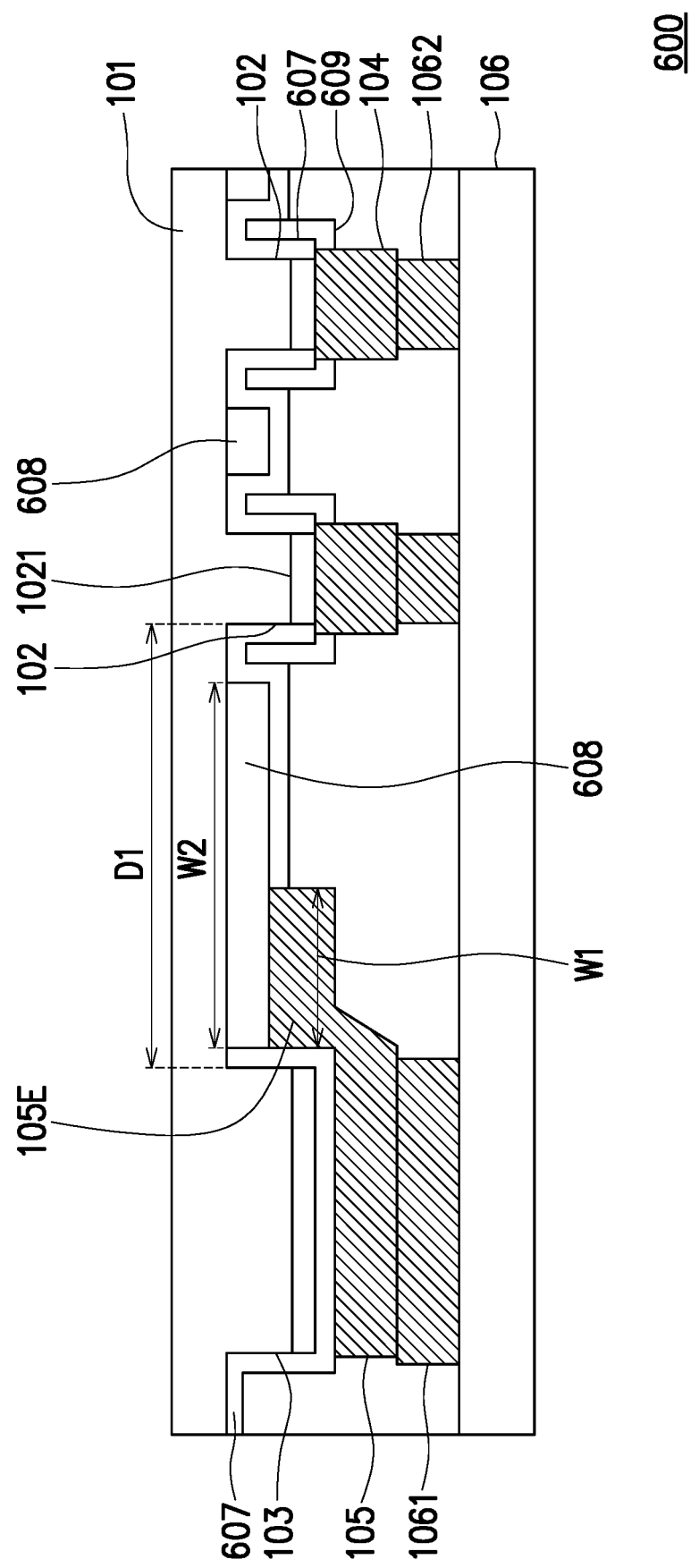

With reference to FIG. 6A and FIG. 6B, FIG. 6A is a schematic plan view illustrating a micro light-emitting diode display 600 according to a sixth embodiment of the disclosure, and 6B is a cross-sectional view illustrating the micro light-emitting diode display 600 taken along a line I-I'. The micro light-emitting diode display 600 includes the first-type semiconductor base layer 101, the plurality of semiconductor light-emitting mesas 102, the semiconductor heightening portion 103, the first bonding metal layer 105, the plurality of second bonding metal layers 104, the circuit substrate 106, the third bonding metal layer 1061, the plurality of fourth bonding metal layers 1062, and a conductive layer 608.

In this embodiment, the conductive layer 608 is further disposed. The conductive layer 608 is a patterned structure, and the conductive layer 608 and the semiconductor light-emitting mesas 102 are distributed on the first-type semiconductor base layer 101 in an alternating manner. The extension section 105E of the first bonding metal layer 105 is electrically bonded to the first-type semiconductor base layer 101 through the conductive layer 608. A material of the conductive layer 608 may include chromium, platinum, gold, aluminum, titanium, silicon, silver, copper, tin, nickel, indium, an alloy of the foregoing elements, a transparent conductive film such as indium tin oxide, or a combination thereof, which should however not be construed as limitations to the disclosure. For instance, the conductive layer 608 may be one of a metal oxide layer and graphene. To be specific, since a resistance value of the conductive layer 608 is less than that of the first-type semiconductor base layer 101, electrons (or holes) may be easily transmitted to the semiconductor light-emitting mesas 102 away from the first bonding metal layer 105. In this way, the semiconductor light-emitting mesas 102 away from the first bonding metal layer 105 still have sufficient electron-hole pairs for recombination, and uniformity of overall brightness of the micro light-emitting diode display 600 is thereby further improved.

In an embodiment of the disclosure, a minimum distance between the semiconductor heightening portion 103 and a closest semiconductor light-emitting mesa 102 in a direction is D1, the extension section 105E of the first bonding metal layer 105 is of a width W1 in this direction, and the conductive layer 608 is of a width W2 in this direction. Herein, the width W1 of the extension section 105E is less than the width W2 of the conductive layer 608, and the width W2 of the conductive layer 608 is less than the distance D1. The width W1 of the extension section 105E is greater than 0.1 micrometers, and the distance D1 is less than 5 millimeters, which should however not be construed as limitations to the disclosure.

In the embodiments of FIG. 6A and FIG. 6B, the micro light-emitting diode display 600 further includes an insulating layer 607 and a plurality of reflective metal layers 609. The reflective metal layers 609 are respectively disposed on the side surfaces of the semiconductor light-emitting mesas 102. Each of the reflective metal layers 609 is configured to reflect the light beam emitted from the light-emitting layer 1021 of a corresponding one of the semiconductor light-emitting mesas 102, so that light output of a display surface of the micro light-emitting diode display 600 is increased, and mixing caused by light beams emitted from the light-emitting layers 1021 of the different semiconductor light-emitting mesas 102 is also prevented. The insulating layer 607 is disposed between each of the reflective metal layers 609 and the corresponding semiconductor light-emitting mesa 102 to insulate the reflective metal layers 609 and the semiconductor light-emitting mesas 102 and to prevent short circuits between the reflective metal layers 609 and the semiconductor light-emitting mesas 102. The reflective metal layers 609 may include a conductive material such as aluminum, titanium, silver, and chromium, which should however not be construed as limitations to the disclosure.

Note that the conductive layer 608 and/or the reflective metal layers 609 shown in FIG. 6A and FIG. 6B may also be implemented in the embodiments of FIG. 1 to FIG. 5 together with an insulating material, and in this way, electrical conduction and optical performance in these embodiments may be further enhanced.

Figure 7:
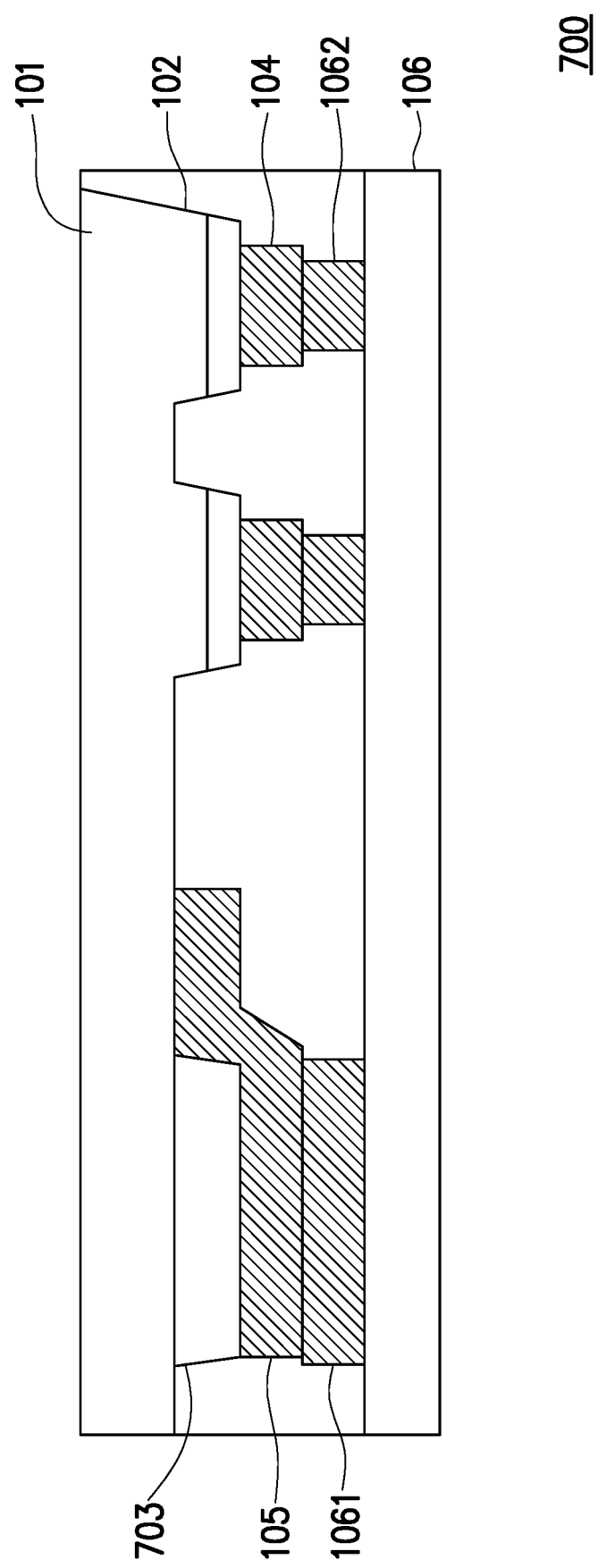
FIG. 7 is a cross-sectional view illustrating a portion of a micro light-emitting diode display according to a seventh embodiment of the disclosure.

With reference to FIG. 7, which is a cross-sectional view illustrating a portion of a micro light-emitting diode display 700 according to a seventh embodiment of the disclosure. The micro light-emitting diode display 700 includes the first-type semiconductor base layer 101, the plurality of semiconductor light-emitting mesas 102, an insulating heightening portion 703, the first bonding metal layer 105, the plurality of second bonding metal layers 104, the circuit substrate 106, the third bonding metal layer 1061, the plurality of fourth bonding metal layers 1062, and the insulating layer 507. A difference between the micro light-emitting diode display 700 and the micro light-emitting diode display 100 is an arrangement of the insulating heightening portion 703, and the semiconductor heightening portion 103 provided in the micro light-emitting diode display 100 is not arranged herein. Same as the micro light-emitting diode display 100, in the micro light-emitting diode display 700, a voltage is applied by the circuit substrate 106 through the third bonding metal layer 1061 and the fourth bonding metal layers 1062. A current (or an electron flow) reaches the first-type semiconductor base layer 101 from the circuit substrate 106 by passing through the third bonding metal layer 1061 and the first bonding metal layer 105. Further, together with an electron flow (or a current) passing through the fourth bonding metal layers 1062 and the second bonding metal layers 104, the semiconductor light-emitting mesas 102 generate electrons and holes. The electrons and holes recombine in the light-emitting layers 1021, so that the light-emitting layers 1021 emit light.

Further, electrical insulation of the insulating heightening portion 703 refers to insulation with respect to the first bonding metal layer 105. The insulating heightening portion 703 is not required to be limited to be entirely made of an insulating material in the disclosure. For instance, in other embodiments, the insulating heightening portion 703 may only be coated with an insulating material at a surface thereof to achieve an insulting effect, as shown in FIG. 2 and FIG. 6B. Alternatively, in some more embodiments, the insulating heightening portion 703 may be a non-doped region (for example, doped with a gate structure) to accordingly form electrical insulation.

In other embodiments of the disclosure, similar to the second embodiment to the sixth embodiment, the arrangement of the micro light-emitting diode display 700 is changed, for example, the insulating layer, the conductive layer, and the reflective metal layers are arranged. Detailed implementation may be found with reference to the description of the micro light-emitting diode displays provided in the second embodiment to the sixth embodiment in detail, and description thereof is not repeated herein.

In view of the foregoing, in the micro light-emitting diode display provided by the embodiments of the disclosure, the semiconductor heightening portion or the insulating heightening portion is provided, and in this way, the bonding region corresponding to the first-type semiconductor and the bonding region corresponding to the second-type semiconductor are coplanar. In particular, in the micro light-emitting diode display having the semiconductor heightening portion, the semiconductor heightening portion may be fabricated through the process of fabricating the semiconductor light-emitting mesas. In this way, time and costs of fabricating the micro light-emitting diode display are lowered, and the bonding yield problem caused by the film thickness accuracy of the metal heightening layer in the related art is also avoided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro light-emitting diode display, comprising:
   a first-type semiconductor base layer;
   a plurality of semiconductor light-emitting mesas, dispersedly disposed on the first-type semiconductor base layer;
   a semiconductor heightening portion, disposed on the first-type semiconductor base layer, wherein a top surface of the semiconductor heightening portion facing away from the first-type semiconductor base layer and a plurality of top surfaces of the semiconductor light-emitting mesas facing away from the first-type semiconductor base layer are coplanar;
   a first bonding metal layer, disposed on the semiconductor heightening portion and comprising an extension section extending from a side surface of the semiconductor heightening portion to the first-type semiconductor base layer, wherein the top surface of the semiconductor heightening portion is a continuous and flat surface, and a contact surface between the top surface and the first bonding metal layer is in the continuous and flat surface; and
   a plurality of second bonding metal layers, respectively disposed on the semiconductor light-emitting mesas;
   wherein the top surface of the semiconductor heightening portion forms a first bonding surface adjacent to the first bonding metal layer, the top surfaces of the semiconductor light-emitting mesas respectively form a plurality of second bonding surfaces adjacent to the second bonding metal layers, and the first bonding surface and the second bonding surfaces are coplanar.

2. The micro light-emitting diode display according to claim 1, wherein each of the semiconductor light-emitting mesas comprises a second-type semiconductor layer, and an electrical polarity of the second-type semiconductor layer is opposite to an electrical polarity of the first-type semiconductor base layer.

3. The micro light-emitting diode display according to claim 2, wherein an electrical polarity of the first bonding metal layer is opposite to an electrical polarity of the second bonding metal layers.

4. The micro light-emitting diode display according to claim 1, further comprising a conductive layer, wherein the conductive layer is a patterned structure, the conductive layer and the semiconductor light-emitting mesas are distributed on the first-type semiconductor base layer in an alternating manner, and the extension section is electrically connected to the first-type semiconductor base layer through the conductive layer.

5. The micro light-emitting diode display according to claim 1, wherein in a direction perpendicular to the first-type semiconductor base layer, a deposition thickness of the first bonding metal layer is equal to a deposition thickness of the second bonding metal layers.

6. The micro light-emitting diode display according to claim 1, further comprising:
   a circuit substrate;
   a third bonding metal layer, electrically bonding the first bonding metal layer and the circuit substrate; and
   a plurality of fourth bonding metal layers, electrically bonding the second bonding metal layers and the circuit substrate, wherein a bonding surface between the first bonding metal layer and the third bonding metal layer is coplanar with a bonding surface between each of the second bonding metal layers and a corresponding one of the fourth bonding metal layers.

7. The micro light-emitting diode display according to claim 1, wherein each of the semiconductor light-emitting mesas and the semiconductor heightening portion comprises:
   a second-type semiconductor layer; and
   an active layer, located between the first-type semiconductor base layer and the second-type semiconductor layer, wherein the semiconductor heightening portion is a dummy semiconductor layer.

8. The micro light-emitting diode display according to claim 1, further comprising an insulating layer, covering a portion of each of the semiconductor light-emitting mesas and exposing another portion of each of the semiconductor light-emitting mesas to be bonded to a corresponding one of the second bonding metal layers.

9. The micro light-emitting diode display according to claim 8, wherein the insulating layer has a plurality of openings to expose the other portions of the semiconductor light-emitting mesas, and the second bonding metal layers are embedded in the openings to be bonded to the corresponding semiconductor light-emitting mesas.

10. The micro light-emitting diode display according to claim 9, wherein top surfaces of the second bonding metal layers facing away from the first-type semiconductor base layer are aligned with a top surface of the insulating layer facing away from the first-type semiconductor base layer.

11. The micro light-emitting diode display according to claim 8, wherein the insulating layer further covers the semiconductor heightening portion.

12. The micro light-emitting diode display according to claim 11, wherein a bonding surface between the insulating layer and the first bonding metal layer is coplanar with a bonding surface between the insulating layer and the second bonding metal layers.

13. The micro light-emitting diode display according to claim 8, further comprising a plurality of reflective metal layers, respectively disposed on side surfaces of the semiconductor light-emitting mesas, wherein the insulating layer is disposed between each of the reflective metal layers and a corresponding one of the semiconductor light-emitting mesas.

14. The micro light-emitting diode display according to claim 1, further comprising an insulating layer, disposed between the semiconductor heightening portion and the first bonding metal layer, wherein the insulating layer is located on the top surface of the first bonding surface bonded to the semiconductor heightening portion.

15. A micro light-emitting diode display, comprising:
- a first-type semiconductor base layer;
- a plurality of semiconductor light-emitting mesas, dispersedly disposed on the first-type semiconductor base layer;
- an insulating heightening portion, disposed on the first-type semiconductor base layer, wherein a top surface of the insulating heightening portion facing away from the first-type semiconductor base layer and a plurality of top surfaces of the semiconductor light-emitting mesas facing away from the first-type semiconductor base layer are coplanar;
- a first bonding metal layer, disposed on the insulating heightening portion, wherein the insulating heightening portion has electrical insulation with respect to the first bonding metal layer; and
- a plurality of second bonding metal layers, respectively disposed on the semiconductor light-emitting mesas.

16. The micro light-emitting diode display according to claim 15, wherein the first bonding metal layer comprises an extension section extending from a side surface of the insulating heightening portion to the first-type semiconductor base layer.

17. The micro light-emitting diode display according to claim 16, further comprising a conductive layer, wherein the conductive layer is a patterned structure, the conductive layer and the semiconductor light-emitting mesas are distributed on the first-type semiconductor base layer in an alternating manner, and the extension section is electrically connected to the first-type semiconductor base layer through the conductive layer.

18. The micro light-emitting diode display according to claim 15, further comprising:
- a circuit substrate;
- a third bonding metal layer, electrically bonding the first bonding metal layer and the circuit substrate; and
- a plurality of fourth bonding metal layers, electrically bonding the second bonding metal layers and the circuit substrate, wherein a bonding surface between the first bonding metal layer and the third bonding metal layer is coplanar with a bonding surface between each of the second bonding metal layers and a corresponding one of the fourth bonding metal layers.

19. The micro light-emitting diode display according to claim 15, further comprising an insulating layer, covering a portion of each of the semiconductor light-emitting mesas and exposing another portion of each of the semiconductor light-emitting mesas to be bonded to a corresponding one of the second bonding metal layers.

20. The micro light-emitting diode display according to claim 19, wherein the insulating layer has a plurality of openings to expose the other portions of the semiconductor light-emitting mesas, and the second bonding metal layers are embedded in the openings to be bonded to the corresponding semiconductor light-emitting mesas.

21. The micro light-emitting diode display according to claim 20, wherein top surfaces of the second bonding metal layers facing away from the first-type semiconductor base layer are aligned with a top surface of the insulating layer facing away from the first-type semiconductor base layer.

* * * * *